(12) United States Patent
Matsuoka

(10) Patent No.: US 6,294,951 B1
(45) Date of Patent: Sep. 25, 2001

(54) TIME DOMAIN FILTER CIRCUIT

(75) Inventor: Toshiaki Matsuoka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/549,042

(22) Filed: Apr. 13, 2000

(30) Foreign Application Priority Data

Aug. 31, 1999 (JP) .................................................. 11-245386

(51) Int. Cl.$^7$ ...................................................... H03K 5/00

(52) U.S. Cl. ......................... 327/551; 327/227; 327/310; 360/46

(58) Field of Search ..................................... 327/310, 552, 327/557, 559, 227, 167, 336, 551; 360/46

(56) References Cited

U.S. PATENT DOCUMENTS 4,780,888 * 10/1988 Solhjell et al. ...................... 375/103

FOREIGN PATENT DOCUMENTS

A61152116    7/1976   (JP) .

* cited by examiner

Primary Examiner—Dinh T. Le

(57) ABSTRACT

A time domain filter circuit is provided with a switch for prohibiting inputting for the time between a change of an input signal and discharging a capacitor to 0, prior to a monostable multivibrator, so that a change of the next input signal is not accepted for a fixed time period since the input signal has been inverted. The time domain filter circuit detects a change of an input signal relative to an output signal, and detects a predetermined fixed time period based on the timing of the change by the monostable multivibrator using a charging time constant of the capacitor, so that an output signal level is changed so as to correspond to the input signal after the predetermined fixed time period elapses. With this arrangement, in the time domain filter circuit disposed in an FDD read-data reproducing device so as to eliminate a level-shift such as saddling of an input signal that appears before the fixed period of time elapses, it is possible to prevent a reading error caused by a high-frequency noise that appears when a non-recording medium is read.

12 Claims, 6 Drawing Sheets

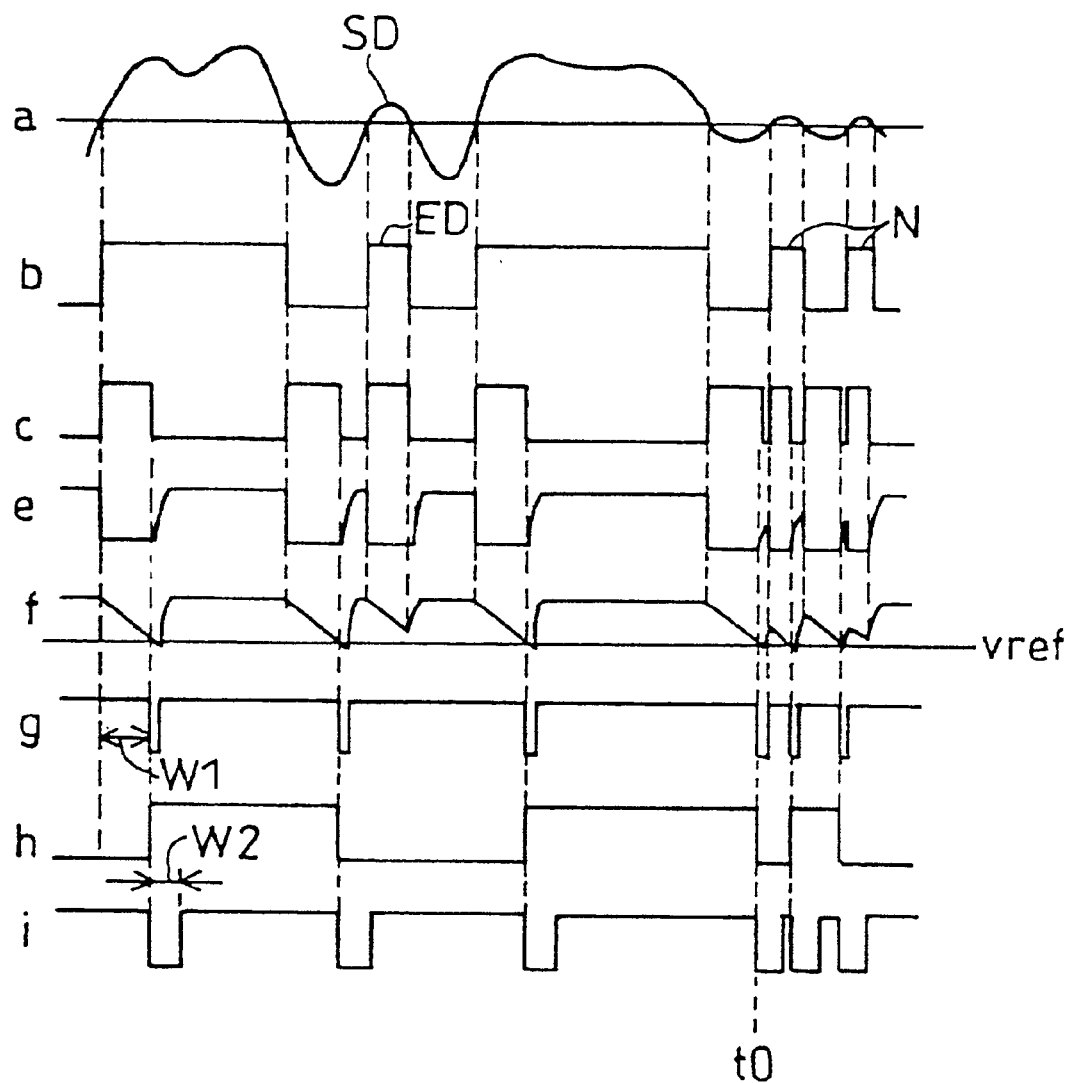

TIME DOMAIN FILTER CIRCUIT

FIELD OF THE INVENTION

The present invention relates to a time domain filter circuit that can be suitably used in an FDD (floppy disk drive) reading circuit and others.

BACKGROUND OF THE INVENTION

A time domain filter circuit is devised to remove a pulse having a pulse width being shorter than a predetermined time, from pulses obtained by performing a level discrimination on input signals, so as to prevent noise. As a typical conventional art, for example, a circuit disclosed in Japanese Published Unexamined Patent Publication No. 152116/1986 (Tokukaisho 61-152116, published on Jul. 10, 1986) has been known. FIG. 5 is a block diagram showing an FDD read-data reproducing device 2 including a time domain filter 1 devised in accordance with the conventional art. Further, FIG. 6 is a timing chart for explaining an operation of the circuit shown in FIG. 5, and each signal name corresponds to each of nodes 'a' through 'i' of FIG. 5.

Reproduction signals, which are reproduced in a reproducing head 3 are inputted to a signal processing circuit 4 as differential signals having opposite phases, are subjected to operations of amplification, filtering, and differentiation, and are inputted to a comparing circuit 5. For a simple explanation, regarding a signal of node 'a', FIG. 5 shows only one of the differential signals that is inputted to one of inputs of the comparing circuit 5; however, in an actual arrangement, a signal having a phase being opposite to a node 'a' signal is inputted to the other input of the comparing circuit 5. An input signal (node 'a') to the comparing circuit 5 has waveform distortion of saddling SD due to the differentiation. Due to such waveform distortion, an error data ED appears in the output (node 'b') of the comparing circuit 5. The error data ED is removed in the time domain filter 1 in the next step as follows:

The time domain filter 1 schematically consists of an exclusive OR 6, a monostable multivibrator 7, and a D-type flip-flop 8. The output (node 'b') of the comparing circuit 5 is inputted to one of inputs of the exclusive OR circuit 6 and to a data input D of the D-type flip-flop 8. An output signal (node 'h') of the time domain filter 1, that also serves as a Q output of the D-type flip-flop 8, is inputted to the other input of the exclusive OR circuit 6.

Therefore, when a signal inputted to the time domain filter 1 is changed, the output (node 'c') of the exclusive OR circuit 6 is changed to "H" so as to detect a change of the input signal. The signal acts as a trigger so as to operate the monostable multivibrator 7. After a predetermined time W1 elapses, an "L" pulse (node 'g') is inputted to a clock of the D-type flip-flop 8 so as to change the Q output of the D-type flip-flop 8. Namely, the circuit construction is arranged as follows: after the time W1 elapses since an input signal (node 'b') to the time domain filter 1 has been changed, an output signal (node 'h') of the time domain filter 1 is changed.

Here, the following explanation describes an operation of the monostable multivibrator 7 in detail. The output of the exclusive OR circuit 6 is connected to the base of an NPN transistor 11, the collector of the NPN transistor 11 is connected to the base of an NPN transistor 12 and to a high-level power supply via a resistance 13, and the emitter of the NPN transistor 11 is grounded via a resistance 14.

The emitter of the NPN transistor 12 is grounded via a constant-current power supply 15 and is connected to a non-inverse input end of the comparing circuit 16, and the collector of the NPN transistor 12 is connected to the high-level power supply. A capacitor 17 is connected in parallel with the NPN transistor 12. A reference voltage vref is applied from a reference voltage source supply 18 to an inverse input end of the comparing circuit 16.

Therefore, when the base potential of the NPN transistor 11 is "L", the NPN transistor 11 is interrupted, a base potential (node 'e') of the NPN transistor 12 is pulled up to "H" in the resistance 13, and the NPN transistor 12 is brought into conduction so as to supply current drawn by the constant-current power supply 15 and to cause a short circuit between terminals, thereby discharging the capacitor 17. At this time, an emitter potential (node 'f') of the NPN transistor 12, namely, a voltage at the non-inverse input end of the comparing circuit 16 is at a high level.

Meanwhile, when the base of the NPN transistor 11 is "H", the NPN transistor 11 is brought into conduction, and the base potential of the NPN transistor 12 becomes "L" due to a voltage drop caused by the collector current. As a result, the NPN transistor 12 is interrupted, and when current is drawn by the constant-current power supply 15, the charging of the capacitor 17 begins. At this time, an emitter potential (node 'f') of the NPN transistor 12, namely, a voltage at the non-inverse input end of the comparing circuit 16 is reduced by the charging at a speed determined by a capacitance of the capacitor 17 and a current value of the constant-current power supply 15. After the time W1 elapses, the voltage is reduced to the reference voltage vref or less, the output (node 'g') of the comparing circuit 16 becomes "L", and the clock is inputted to the D-type flip-flop 8.

As described above, in the monostable multivibrator 7, a rise of the output of the exclusive OR circuit 6 acts as a trigger, and after the predetermined time W1 elapses, the "L" level is outputted from the output of the comparing circuit 16 to the clock input of the D-type flip-flop 8. When the "L" clock is inputted to the D-type flip-flop 8, the Q output (node 'h') of the D-type flip-flop 8 becomes equal to the input signal (node 'b').

Hence, as in the case of the saddling SD of the input signal (node 'b'), even when an output of the comparing circuit 5 is changed at an interval being shorter than the time W1, the error data ED is reset to the "H" level before an emitter potential (node 'f') of the NPN transistor 12 is reduced to the reference voltage vref, so that the clock is not inputted to the D-type flip-flop 8 so as to remove the error data ED. Namely, regarding the saddling SD, a signal varies at an interval being shorter than the time W1, the effect thereof is eliminated so as to prevent the occurrence of the error data ED.

The Q output (time domain filter output) of the D-type flip-flop 8 is inputted to a read-data output pulse width setting circuit 9, is shaped into a predetermined pulse width W2 having a change of an output of the time domain filter 1 as a trigger, and is outputted as read data (node The time domain filter 1 of the above conventional art makes it possible to remove the effect of waveform distortion such as the saddling SD. However, when a high-frequency noise N is inputted, a pulse interval of the read data becomes shorter than the time W1. The high-frequency noise N appears upon reading a non-recording medium.

Namely, as shown in FIG. 6, at a time t0 or later, immediately after the Q output (node 'h') of the D-type flip-flop 8 is changed, the output (node 'b') of the comparing circuit 5 is changed, so that the charging is resumed before the capacitor 17 is fully discharged (while potentials of the nodes 'e' and 'f' are not sufficiently raised), resulting in an output at an interval being shorter than the time W1 (node 'h'). For example, when the node 'e' has a parasite capacitance of 1 pF and the resistance 13 has a resistance value of 10 kΩ, a time constant for changing the node 'e' to "H" is 10 ns. When the output of the comparing circuit 5 is changed at less than 10 ns, the aforementioned malfunction occurs.

For this reason, even when the time W1 is set at 2 μs, which is determined by the capacitance of the capacitor 17, the current value of the constant-current power supply 15, and the reference voltage vref, the output of the time domain filter 1 is outputted at an interval being shorter than the predetermined width (2 μs).

As described above, regarding the conventional time domain filter 1, when another signal is inputted when the capacitor 17 is not fully discharged in the monostable multivibrator 7, an interval of an output signal is reduced. Hence, for example, in the FDD reading circuit, when the output interval of the time domain filter 1 is reduced, a pulse interval of the read-data output pulse (node 'i') is reduced accordingly, so that a reading error may occur during an inspection of the FDD or in a state connection is made to a personal computer and the like.

SUMMARY OF THE INVENTION

The objective of the present invention is to provide a time domain filter circuit which can prevent an error from occurring in a high-frequency noise.

In order to achieve the above objective, the time domain filter circuit of the present invention for preventing an input signal from being level-shifted before a predetermined fixed time elapses, is provided with a monostable multivibrator which detects the fixed time period based on a timing of a change of an input signal by using a time constant of charge or discharge of a capacitor, and changes an output signal level according to the input signal after the fixed time period elapses, so as to detect the change relative to the output signal; and a gate which prohibits inputting for the time between the timing of change and discharging the capacitor to 0 or charging the capacitor to a specified amount of charge, prior to the monostable multivibrator.

According to this arrangement, in the time domain filter circuit, a pulse having a pulse width being shorter than the fixed time period is removed from input pulses obtained by level-discriminating signals used in an FDD reading circuit and the like, so that noise such as a saddling can be prevented in the FDD reading circuit. In the monostable multivibrator of the circuit, in order to prevent the capacitor, which regulates the fixed time period based on a time constant of charging or discharging, from being charged or discharged such that an output signal is level-shifted before the fixed time period elapses in a state in which the capacitor is not discharged to 0 or is not charged to the specified amount of charge, the gate prohibits inputting to the monostable multivibrator for the required for discharging to 0 or charging to the specified amount of charge. Namely, for a fixed time period since an input signal has been inverted, a change of the next input signal is not accepted.

It is therefore possible to remove a high-frequency noise component of an input signal which frequently varies for the time of shorter than the fixed time period. The high-frequency noise component includes high-frequency noise which appears when a non-recording medium is read in the FDD reading circuit, and in other states. Consequently, the occurrence of an error can be prevented.

For a fuller understanding of the nature and advantages of the invention, reference should be made to the ensuing detailed description taken in conjunction with the accompanying drawings.

BRIEF DESCRIPTION OF THE DRAWINGS

FIG. 6 is a timing chart for explaining an operation of a circuit shown FIG. 5.

DESCRIPTION OF THE EMBODIMENTS

Figure 1:
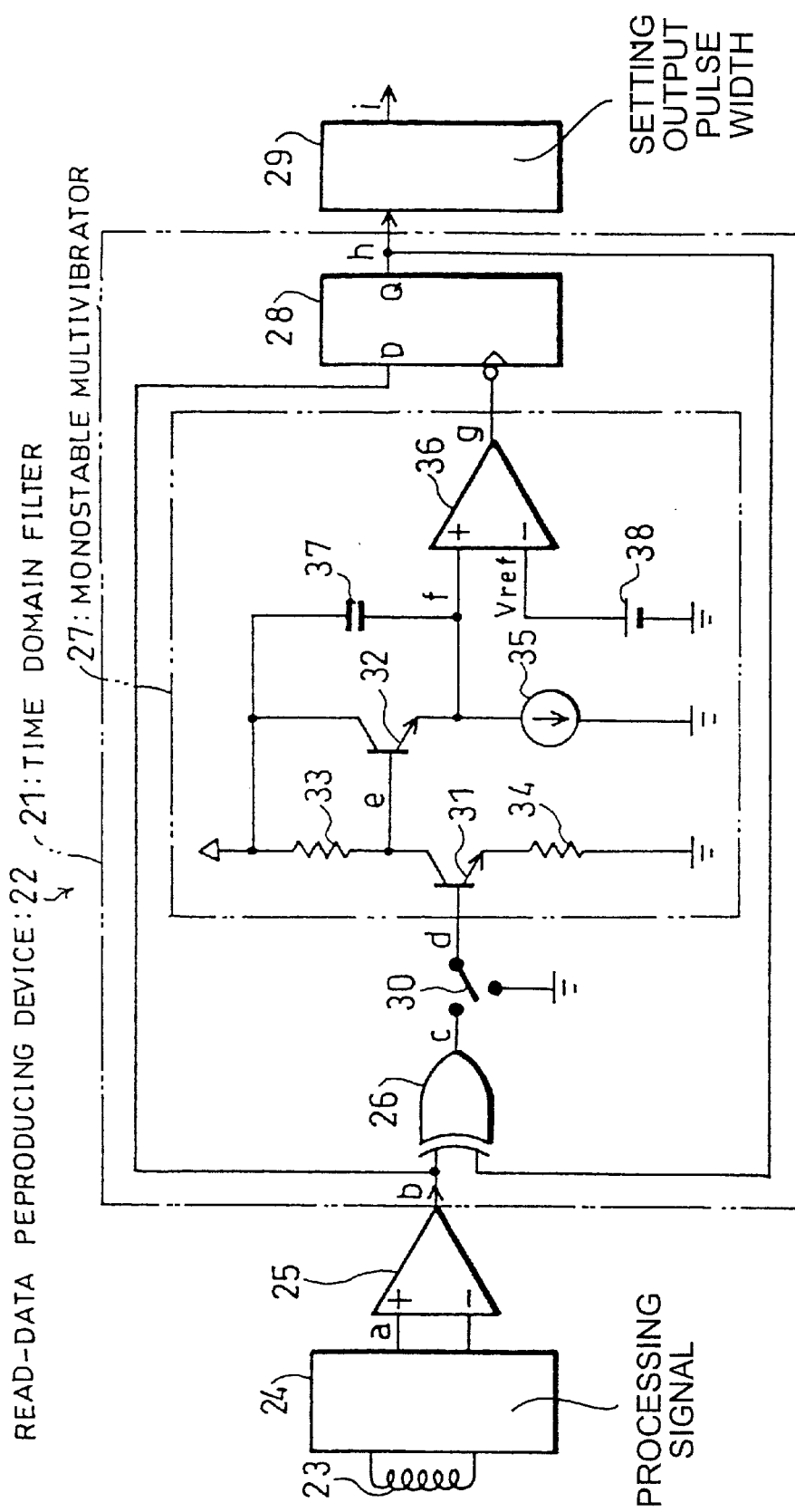
FIG. 1 is a block diagram showing an FDD read-data reproducing device having a time domain filter in accordance with an example of the present invention.
Figure 2:
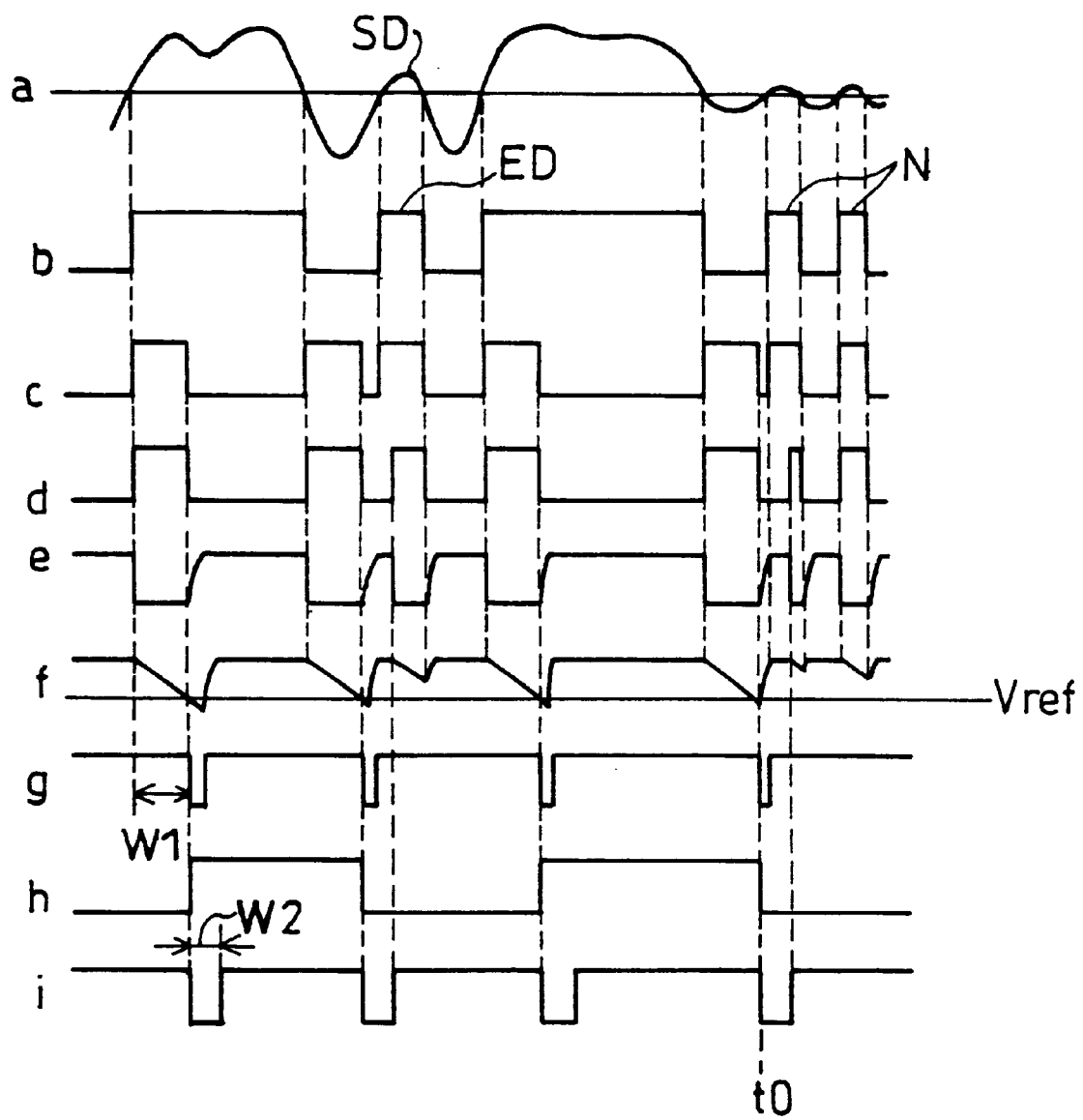
FIG. 2 is a timing chart for explaining an operation of the circuit shown in FIG. 1.

Referring to FIGS. 1 and 2, the following explanation discusses one example of the present invention.

FIG. 1 is a block diagram showing an FDD read-data reproducing device 22 being provided with a time domain filter 21 devised in accordance with one example of the present invention. Further, FIG. 2 is a timing chart for explaining an operation of the circuit shown in FIG. 1. Each signal name of FIG. 2 corresponds to each of nodes 'a' through 'i' of FIG. 1.

Reproduction signals, which are reproduced in a reproducing head 23, are inputted to a signal processing circuit 24 as differential signals having opposite phases, are subjected to operations of amplification, filtering, and differentiation, and are inputted to a comparing circuit 25. For a simple explanation, regarding a signal of node 'a', FIG. 1 shows only one of the differential signals that is inputted to one of the inputs of the comparing circuit 25; however, in an actual arrangement, a signal having a phase being opposite to a node 'a' signal is inputted to the other input of the comparing circuit 25. An input signal (node 'a') to the comparing circuit 25 has waveform distortion of saddling SD due to the differentiation. Because of such waveform distortion, an error data ED appears in the output (node 'b') of the comparing circuit 25. The error data ED is removed in the time domain filter 21 in the next step as follows:

The time domain filter 21 schematically consists of an exclusive OR circuit 26, a switch (gate means) 30, a monostable multivibrator 27, and a D-type flip-flop 28. The output (node 'b') of the comparing circuit 25 is inputted to one of inputs of the exclusive OR circuit 26 and to a data input D of the D-type flip-flop 28. To the other input of the exclusive OR circuit 26, an output signal (node 'h') of the time domain filter 21, that serves as a Q output of the D-type flip-flop 28, is inputted.

Therefore, when an input signal to the time domain filter 21 is changed, the output of the exclusive OR circuit 26 (nodes 'c' and 'd') is changed to "H" so as to detect a change of the input signal. The monostable multivibrator operates in which the signal acting as a trigger via the switch 30. After a predetermined time Wi elapses, an "L" pulse is inputted to a clock terminal (node "g") of the D-type flip-flop 28 so as to change the Q output of the D-type flip-flop 28. Namely, after the time W1 elapses since the input signal to the time domain filter 21 (node 'b') has been changed, an output signal of the time domain filter 21 (node 'h') is changed.

Here, the following explanation describes an operation of the monostable multivibrator 27 in detail. The output of the switch 30 is connected to the base of an NPN transistor 31, the collector of the NPN transistor 31 is connected to the base of an NPN transistor 32 and to a high-level power supply via a resistance 33, and the emitter of the NPN transistor 31 is grounded via a resistance 34.

The emitter of the NPN transistor 32 is grounded via a constant-current power supply 35 and is connected to a non-inverse input end of the comparing circuit 36, and the collector of the NPN transistor 32 is connected to the high-level power supply. A capacitor 37 is connected in parallel with the NPN transistor 32. A reference voltage Vref is applied from a reference voltage source supply 38 to an inverse input end of the comparing circuit 36.

Therefore, when the base potential of the NPN transistor 31 is "L", the NPN transistor 31 is interrupted, a base potential (node 'e') of the NPN transistor 12 is pulled up to "H" in the resistance 33. Consequently, the NPN transistor 32 is brought into conduction so as to supply current being equivalent to that drawn by the constant-current power supply 35 and to cause a short circuit between terminals, thereby discharging the capacitor 37. At this time, an emitter potential (node 'f') of the NPN transistor 32, namely, a voltage at the non-inverse input end of the comparing circuit 36 is at a high level.

Meanwhile, when the base of the NPN transistor 31 is "H", the NPN transistor 31 is brought into conduction, and the base potential of the NPN transistor 32 becomes "L" due to a voltage drop caused by the collector current. As a result, the NPN transistor 32 is interrupted, and when current is drawn by the constant-current power supply 35, the charging of the capacitor 37 begins. At this time, an emitter potential (node 'f') of the NPN transistor 32, namely, a voltage at the non-inverse input end of the comparing circuit 36 is reduced by the charging at a speed determined by a capacitance of the capacitor 37 and a current value of the constant-current power supply 35. After the time W1 elapses, the voltage is reduced to the reference voltage Vref or less, the output (node 'g') of the comparing circuit 36 becomes "L", and the clock is inputted to the D-type flip-flop 28.

As described above, in the monostable multivibrator 27, a rise of the output of the exclusive OR circuit 26 acts as a trigger, and after the predetermined time W1 elapses, the "L" level is outputted from the output of the comparing circuit 36 to the clock input of the D-type flip-flop 28. When the "L" clock is inputted to the D-type flip-flop 28, the Q output (node 'h') of the D-type flip-flop 28 becomes equal to the input signal (node 'b') shown in FIG. 2.

Hence, as in the case of the saddling SD (node 'a') of FIG. 2, even when the output of the comparing circuit 25 is changed at an interval being shorter than the time W1, the error data ED is reset to the "H" level before the emitter potential (node 'f') of the NPN transistor 32 is reduced to the reference voltage Vref, so that the clock is not inputted to the D-type flip-flop 28 so as to remove the error data ED. Namely, regarding the saddling SD, a signal varies at an interval being shorter than the time W1, the effect thereof is eliminated so as to prevent the occurrence of the error data ED.

The Q output (time domain filter output) of the D-type flip-flop 28 is inputted to a read-data output pulse width setting circuit 29 consisting of, for example, a monostable multivibrator, is shaped into a predetermined pulse width W2 having a change of an output of the time domain filter 21 as a trigger, and is outputted as read data (node 'i').

It is noteworthy that in the time domain filter 21, when the switch 30 connects the base of the NPN transistor 31 and the output of the exclusive OR circuit 26, the time domain filter 21 is operated as described above because of the output (node 'c') of the exclusive OR circuit 26=the base input (node 'd') of the NPN transistor 31. Meanwhile, when the switch 30 is interrupted, the NPN transistor 31 is interrupted regardless of the output of the exclusive OR circuit 26.

When the switch 30 is interrupted, a potential of the collector of the NPN transistor 31, namely, a potential of the base (node 'e') of the NPN transistor 32 is charged from the power supply via the resistance 33 to the parasite capacitance of the node 'e' so as to rise with a time constant. A potential of the emitter of the NPN transistor 32, namely, a potential of the node 'f' at the non-inverse input end of the comparing circuit 36 is only level-shifted from a potential of the node 'e' by a voltage between the base and emitter of the NPN transistor 32, so that a potential of the node 'f' rises with the same time constant. For example, the time constant is 10 ns when a parasite capacitance of the node 'e' is 1 pF and the resistance 33 is 10 kΩ. Namely, the switch 30 has been interrupted for the time constant or more, so that the potentials of the nodes 'e' and 'f' rise to "H" level regardless of the output of the exclusive OR circuit 26. Thus, it is possible to prevent a malfunction including a change of the output of the time domain filter 21 at an interval being shorter than the time W1.

However, when the switch 30 has been interrupted for the time W1 or more, a normal signal cannot be received. Hence, it is necessary to set the interruption period within a predetermined period.

As described above, it is possible to prevent the occurrence of a read error that is caused by a shorter pulse interval of the read-data output pulse (node 'i') in the FDD read-data reproducing device 22.

Figure 3:
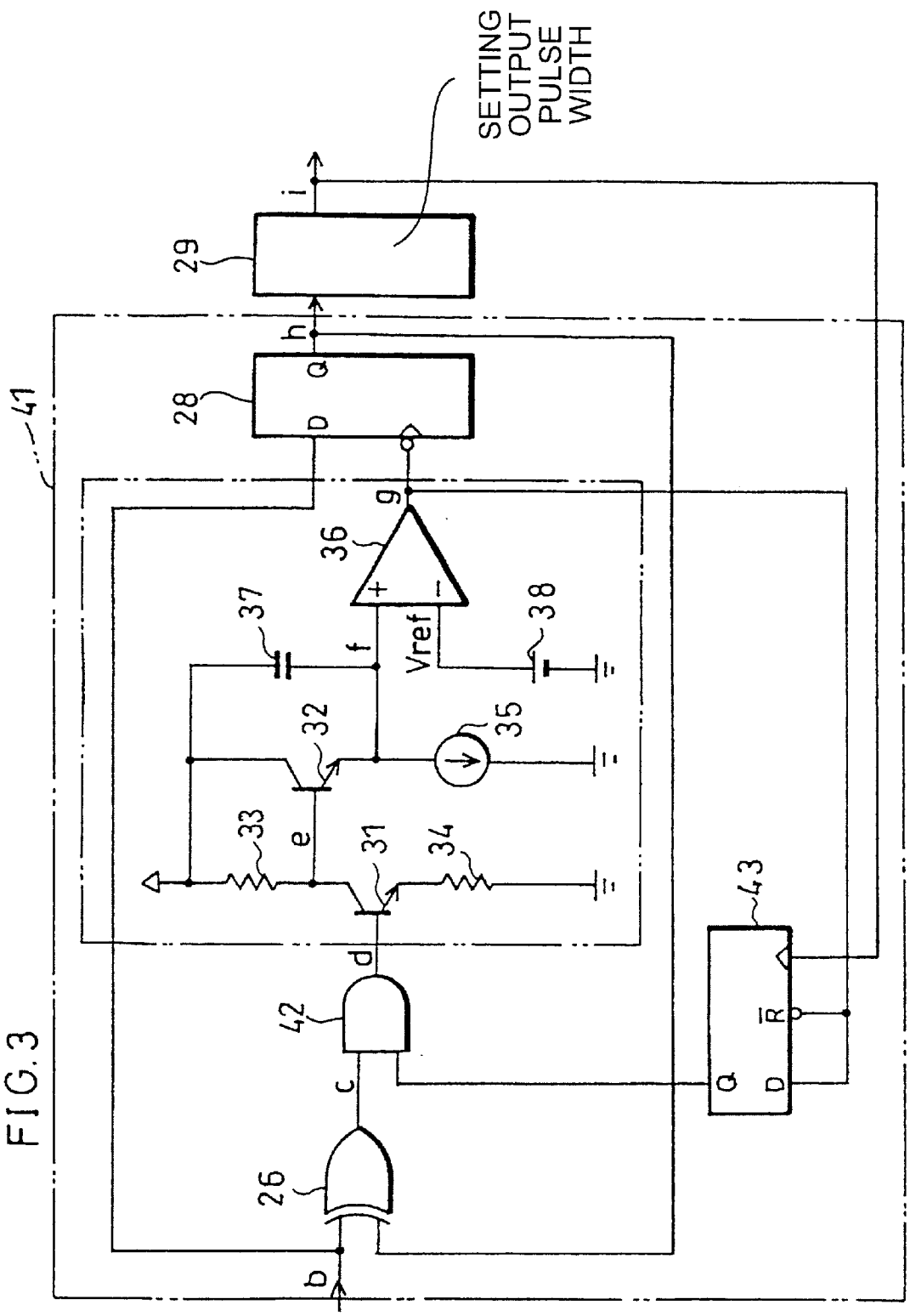
FIG. 3 is a block diagram showing a time domain filter in accordance with another example of the present invention.

Referring to FIGS. 2 and 3, the following explanation describes another example of the present invention.

FIG. 3 is a block diagram showing a time domain filter 41 in accordance with another example of the present invention. The time domain filter 41 is similar to the time domain filter 21, and the interruption period of the switch 30 is set at an "L" period W2 of a read-data output pulse. Hence, an AND gate 42 is disposed between the output of the exclusive OR circuit 26 and the base of the NPN transistor 31. The AND gate 42 is controlled by an interruption period setting D-type flip-flop 43 having a rise of the read-data output pulse as a clock.

Namely, the output of the exclusive OR circuit 26 is applied to one of inputs of the AND gate 42, a Q output of the interruption period setting D-type flip-flop 43 is applied to the other input, and an output of the AND gate 42 is applied to the base of the NPN transistor 31. Accordingly, when the output of the exclusive OR circuit 26 and the Q output of the interruption period setting D-type flip-flop 43 are both at an "H" level, the base of the NPN transistor 31 is at the "H" level so as to bring the NPN transistor 31 into conduction.

Meanwhile, an output of the read-data output pulse width setting circuit 29 is applied to a clock input of the interruption period setting D-type flip-flop 43, and the output of the comparing circuit 36 is applied to a data D input and an inverse reset input/R (/ means inverse).

Therefore, when "L" is inputted to the clock terminal of the D-type flip-flop 28 from the comparing circuit 36, the interruption period setting D-type flip-flop 43 is simultaneously reset so as to set the Q output at "L". Further, the read-data output is set at "L" at the same time, so that the clock of the interruption period setting D-type flip-flop 43 is also set at "L". Namely, until the read-data output is changed to "H", the Q output of the interruption period setting D-type flip-flop 43 is at "L", and the AND gate 42 does not accept the output of the exclusive OR circuit 26 (in FIG. 1, interruption is made by the switch 30).

As described above, as shown by the node 'b' at time to or later, even when the time domain filter input is changed at a short interval, it is possible to achieve a circuit which does not affect the time domain filter output (node 'h'). For example, when the read-data output pulse width is 400 ns, the width is sufficiently longer than the time constant (about ions) determined by the parasite capacitance of the node 'e' and the resistance 33, and the width is sufficiently shorter than the time W1, for example, 1 to 2.5 $\mu$s, which is determined by the capacitor 37 and the constant-current power supply 35. Thus, it is only necessary to adopt the interruption period setting D-type flip-flop 43 having the read-data output pulse as a clock so as to control the AND gate 42.

Figure 4:
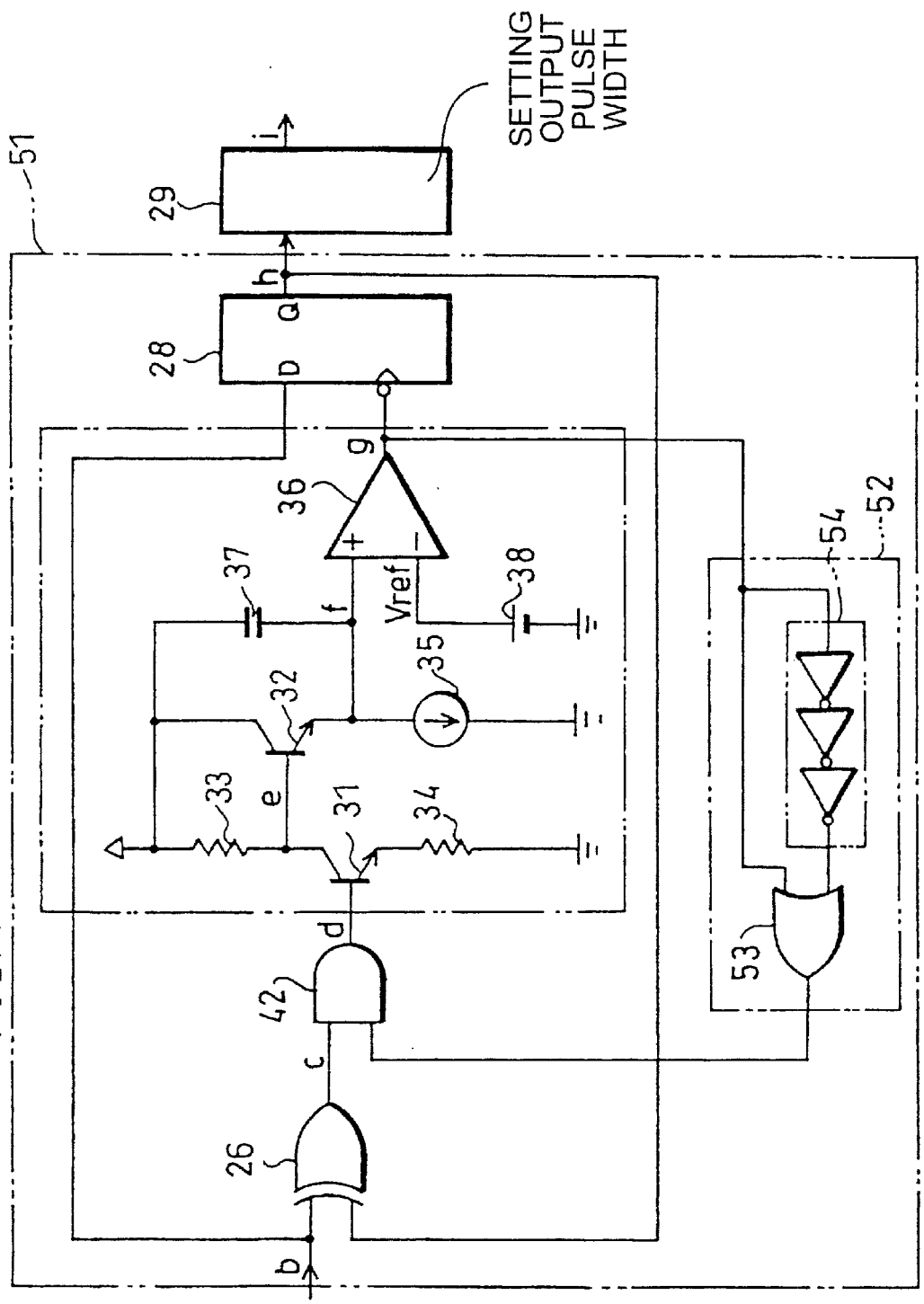
FIG. 4 is a block diagram showing a time domain filter in accordance with still another example of the present invention.
Figure 5:
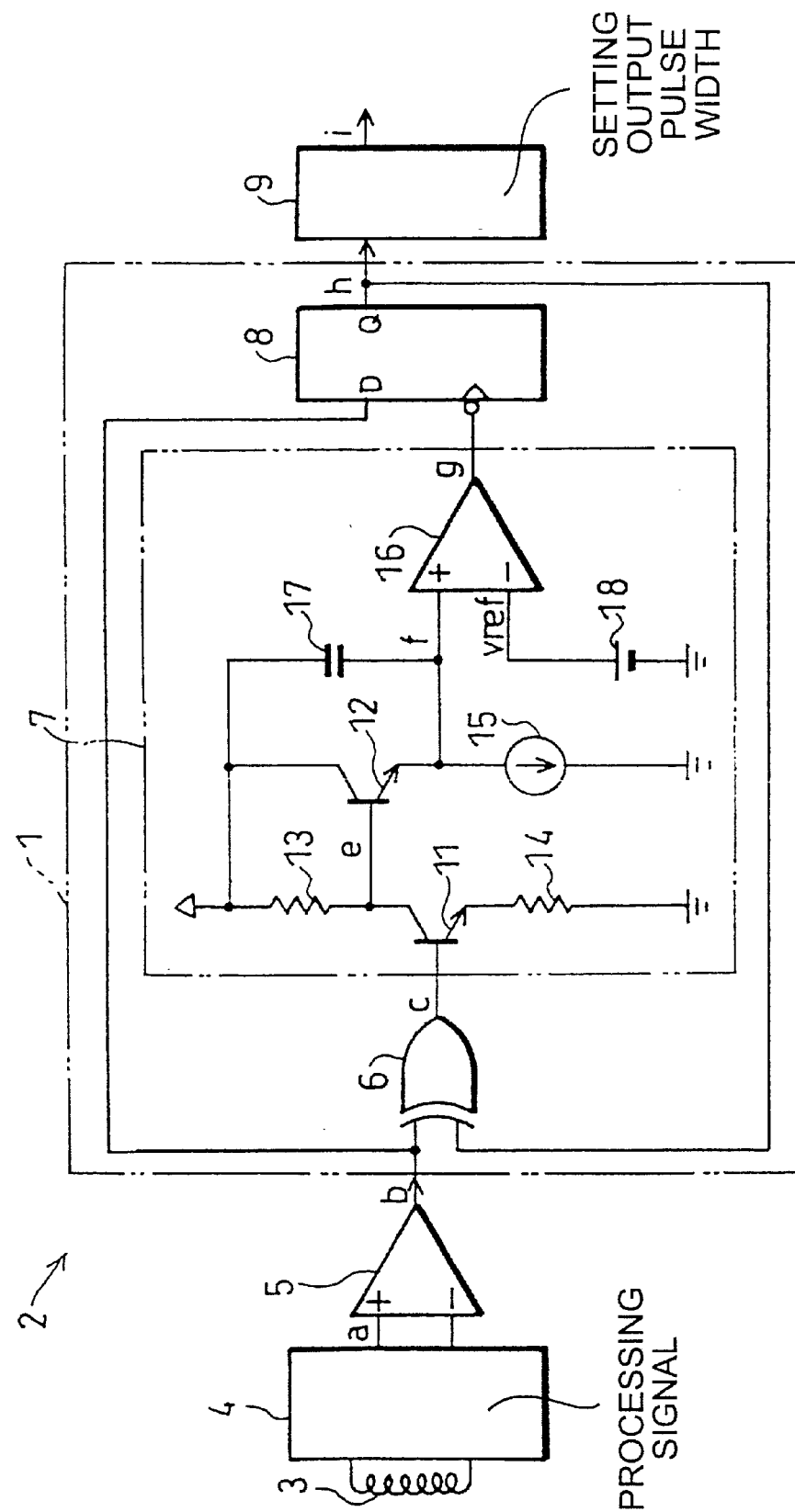
FIG. 5 is a block diagram showing an FDD read-data reproducing device having a conventional time domain filter.

Referring to FIG. 4, the following explanation describes still another example of the present invention.

FIG. 4 is a block diagram showing a time domain filter 51 in accordance with still another example of the present invention. The time domain filter 51 is similar to the time domain filter 41, and the AND gate 42 is controlled by a rise detecting circuit 52 for detecting a rise of an output of the comparing circuit 36, namely, the monostable multivibrator 27. The rise detecting circuit 52 consists of an OR gate 53 and an inversion delay circuit 54.

The output of the comparing circuit 36 is directly applied to one of inputs of the OR gate 53 and to the other input via the inversion delay circuit 54. As shown in FIG. 4, the inversion delay circuit 54 is constituted by an odd number of inverters connected in cascade, and an output of the monostable multivibrator 27 is delayed accordingly to the number of the inverters, is inverted, and is outputted.

Therefore, the rise detecting circuit 52 applies an "L" pulse having a predetermined width to the AND gate 42 in synchronization with the falling output of the monostable multivibrator 27 changing to "L".

With this arrangement, the output of the AND gate 42 is fixed at "L" for a fixed time period since a change of the input signal 'b' has been judged as being effective, so that the output of the exclusive OR circuit 26 is interrupted. The fixed time period can be arbitrarily determined in accordance with the number of inverters in the inversion delay circuit 54.

As described above, a time domain filter circuit of the present invention, in which a change of an input signal is detected relative to an output signal, a fixed time period is previously detected based on a timing of the change by a monostable multivibrator using a time constant of charge or discharge of a capacitor, and an output signal level is changed according to the input signal after the fixed time period elapses, so as to prevent the input signal from being level-shifted before the fixed time period elapses, the time domain filter circuit being provided with a gate means, which prohibits inputting for the time between the timing of change and discharging the capacitor to 0 or charging the capacitor to a specified amount of charge, prior to the monostable multivibrator.

According to this arrangement, in the time domain filter circuit used in an FDD reading circuit and others, a pulse having a pulse width being shorter than the fixed time period is removed from input pulses obtained by level-discriminating signals, so that noise such as a saddling can be prevented in the FDD reading circuit. In the monostable multivibrator of the circuit, in order to prevent the capacitor, which regulates the fixed time period based on a time constant of charging or discharging, from being charged or discharged such that an output signal is level-shifted before the fixed time period elapses in a state in which the capacitor is not discharged to 0 or is not charged to the specified amount of charge, the gate means prohibits inputting to the monostable multivibrator for the time required for discharging to 0 or charging to the specified amount of charge. Namely, for a fixed time period since an input signal has been inverted, a change of the next input signal is not accepted.

It is therefore possible to remove a high-frequency noise component of an input signal which frequently varies for the time of shorter than the fixed time period. The high-frequency noise component includes high-frequency noise which appears when a non-recording medium is read in the FDD reading circuit, and in other states. Consequently, the occurrence of an error can be prevented.

Further, the time domain filter of the present invention is provided with an exclusive OR circuit for comparing an input signal and an output signal with each other so as to detect a change of the input signal, and a filter outputting D-type flip-flop in which an output of the monostable multivibrator serves as a clock, the input signal serves as a data input, and the output signal serves as a Q output.

According to this arrangement, the exclusive OR circuit can detect a change of an input signal relative to the output signal, and the filter outputting D-type flip-flop can change an output signal level in accordance with the input signal after the fixed period time elapses. Consequently, it is possible to complete a specific arrangement of the time domain filter circuit which can prevent an input signal from being level-shifted before the fixed predetermined time elapses.

Furthermore, in the time domain filter circuit of the present invention, an output pulse width setting circuit, which shapes the Q output of the outputting D-type flip-flop into a predetermined pulse width, is connected to the output side, and the gate means is provided with an interruption period setting D-type flip-flop, in which an output of the monostable multivibrator serves as data and reset inputs, and the output of the output pulse width setting circuit serves as a clock; and an AND gate in which the output of the exclusive OR circuit serves as one of inputs, the Q output of the interruption period setting circuit serves as the other output, and an output of the AND gate is connected to the input of the monostable multivibrator.

According to this arrangement, a change of an input signal is judged at a monostable multivibrator output, and the interruption period setting D-type flip-flop is reset at the same time. The Q output of the interruption period setting D-type flip-flop is "L" from when the read-data output turns "L" to when the read-data output turns "H", so that the AND gate does not accept the output of the exclusive OR circuit.

Consequently, it is possible to eliminate a change of an input signal at an interval being shorter than a pulse width of the read-data output so as to prevent the occurrence of a read error.

Moreover, in the time domain filter circuit of the present invention, the gate means has a pulse generating circuit for generating a low-active pulse, which has a pulse width corresponding to the time required for discharging the capacitor to 0 or charging the capacitor to a specified amount of charge, and an AND gate, in which the output of the exclusive OR circuit serves as one of inputs, the output of the pulse generating circuit serves as the other input, and the output of the AND gate is connected to the monostable multivibrator input.

According to this arrangement, in response to the monostable multivibrator output, the pulse generating circuit applies an "L" pulse having a predetermined width to the AND gate. Therefore, for a fixed time period immediately after a change of an input signal is judged as being effective, the output of the AND gate is fixed at "L" and the output of the exclusive OR circuit is interrupted, so that it is possible to prevent occurrence of an error.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A time domain filter circuit, comprising:
    an input change detecting circuit for detecting a change in an input signal to the time domain filter circuit relative to an output signal from the time domain filter circuit, and for providing an output of a detection signal; and
    a monostable multivibrator with a capacitor having a predetermined time constant of charge or discharge, the detection signal being fed to the capacitor,
    the time domain filter circuit preventing the input signal from being level-shifted before a prescribed fixed time elapses from a timing of change of the detection signal, by detecting the fixed time elapsed and changing a level of the output signal according to the input signal after the fixed time elapses,
    wherein gate means are provided between the input change detecting circuit and the monostable multivibrator to prohibit inputting of the detection signal for a predetermined time from the timing of change of the detection signal.

2. The time domain filter circuit as defined in claim 1, wherein the input change detecting circuit is an exclusive OR circuit for comparing the input signal and the output signal with each other so as to detect a change of the input signal, and
    the time domain filter further comprising
    an outputting D-type flip-flop in which an output of said monostable multivibrator serves as a clock, the input signal serves as a data input, and the output signal serves as a Q output.

3. The time domain filter circuit as defined in claim 2, further comprising an output pulse width setting circuit, which is connected to an output side of said outputting D-type flip-flop and shapes the output from the outputting D-type flip-flop into a predetermined pulse width,
    wherein said gate means is provided with an interruption period setting D-type flip-flop, in which the output signal serves as data and reset inputs, and an output of said output pulse width setting circuit serves as a clock, and an AND gate which outputs an AND of the detection signal from the input change detecting circuit and a Q output from the interruption period setting D-type flip-flop to an input of said monostable multivibrator.

4. The time domain filter circuit as defined in claim 1, wherein said gate means has a pulse generating circuit for generating a low-low pulse, which has a pulse width corresponding to a time required for discharging said capacitor to 0 or charging said capacitor to a specified amount of charge according to an output from the monostable multivibrator, and an AND gate for outputting an AND of the detection signal from the input change detecting circuit and an output of said pulse generating circuit to an input side of said monostable multivibrator.

5. The time domain filter circuit as defined in claim 1, wherein the predetermined time is substantially equal to a time required for discharging the capacitor to 0 or charging the capacitor to a specified amount of charge.

6. The time domain filter circuit as defined in claim 1, wherein the predetermined time is longer than, or equal to, a time required for discharging the capacitor to 0 or charging the capacitor to a specified amount of charge and shorter than, or equal to, the fixed time.

7. A read-data reproducing device, comprising:
    a reproducing head for reproducing a signal,
    a signal processing circuit for performing a predetermined processing on differential signals which are reproduced in said reproducing head and have opposite phases,
    a comparing circuit for comparing the differential signals outputted from said signal processing circuit so as to detect a change, and
    a time domain filter circuit for preventing an input signal from being level-shifted before a predetermined fixed time elapses, said time domain filter further including:
        a monostable multivibrator with a capacitor having a predetermined time constant of charge or discharge, the detection signal being fed to the capacitor,
        the time domain filter circuit preventing the input signal from being level-shifted before a prescribed fixed time elapses from a timing of change of the detection signal, by detecting the fixed time elapsed and changing a level of the output signal according to the input signal after the fixed time elapses,
        wherein gate means are provided between the input change detecting circuit and the monostable multivibrator to prohibit inputting of the detection signal for a predetermined time from the timing of change of the detection signal.

8. The read-data reproducing device as defined in claim 7, wherein the input change detecting circuit is an exclusive OR circuit for comparing the input signal and the output signal with each other so as to detect a change of the input signal, and
    the time domain filter further including
    an outputting D-type flip-flop in which an output of said monostable multivibrator serves as a clock, the input signal serves as a data input, and the output signal serves as a Q output.

9. The read-data reproducing device as defined in claim 8, wherein said time domain filter circuit further comprises an output pulse width setting circuit, which is connected to an output side of said outputting D-type flip-flop and shapes the output from the outputting D-type flip-flop into a predetermined pulse width,
    wherein said gate means is provided with an interruption period setting D-type flip-flop, in which the output signal serves as data and reset inputs, and an output of said output pulse width setting circuit serves as a clock, and an AND gate which outputs an AND of the detection signal from the input change detecting circuit and a Q output from the interruption period setting D-type flip-flop to an input of said monostable multivibrator.

10. The read-data reproducing device as defined in claim 7, wherein said gate means has a pulse generating circuit for generating a low-low pulse, which has a pulse width corresponding to a time required for discharging said capacitor to 0 or charging said capacitor to a specified amount of charge according to an output from the monostable multivibrator, and an AND gate for outputting an AND of the detection signal from the input change detecting circuit and an output of said pulse generating circuit to an input side of said monostable multivibrator.

11. The read-data reproducing device as defined in claim 7, wherein the predetermined time is substantially equal to a time required for discharging the capacitor to 0 or charging the capacitor to a specified amount of charge.

12. The read-data reproducing device as defined in claim 7, wherein the predetermined time is longer than, or equal to, a time required for discharging the capacitor to 0 or charging the capacitor to a specified amount of charge and shorter than, or equal to, the fixed time.

* * * * *

UNITED STATES PATENT AND TRADEMARK OFFICE
CERTIFICATE OF CORRECTION

PATENT NO. : 6,294,951 B1
DATED : September 25, 2001
INVENTOR(S) : Toshiaki Matsuoka It is certified that error appears in the above-identified patent and that said Letters Patent is hereby corrected as shown below:

<u>Title page,</u>
Item [56], References Cited, under "FOREIGN PATENT DOCUMENTS," the date should be -- 7/1986 -- and not "7/1976".

Signed and Sealed this

Second Day of July, 2002

Attest:

Attesting Officer

JAMES E. ROGAN
*Director of the United States Patent and Trademark Office*